(12) United States Patent
Fedorov

(10) Patent No.: US 7,545,644 B2
(45) Date of Patent: Jun. 9, 2009

(54) NANO-PATCH THERMAL MANAGEMENT DEVICES, METHODS, & SYSTEMS

(75) Inventor: Andrei G. Fedorov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 41 days.

(21) Appl. No.: 11/748,540

(22) Filed: May 15, 2007

(65) Prior Publication Data

US 2008/0043440 A1 Feb. 21, 2008

Related U.S. Application Data

(60) Provisional application No. 60/800,594, filed on May 16, 2006.

(51) Int. Cl.
*H05K 7/20* (2006.01)
(52) U.S. Cl. .................. 361/699; 361/700; 257/714; 257/715; 174/15.1; 165/80.4; 165/104.21
(58) Field of Classification Search ................. None
See application file for complete search history.

(56) References Cited

U.S. PATENT DOCUMENTS

| | | | |
|---|---|---|---|
| 5,016,090 A * | 5/1991 | Galyon et al. ............... | 257/714 |
| 6,766,817 B2 | 7/2004 | da Silva | |
| 6,918,404 B2 | 7/2005 | Dias da Silva | |
| 6,994,151 B2 * | 2/2006 | Zhou et al. ................. | 165/80.4 |
| 7,066,586 B2 | 6/2006 | da Silva | |
| 7,133,286 B2 * | 11/2006 | Schmidt et al. ............ | 361/718 |
| 7,265,979 B2 * | 9/2007 | Erturk et al. ............... | 361/702 |
| 7,285,255 B2 | 10/2007 | Kadlec et al. | |

2007/0212281 A1 9/2007 Kadlec et al.

OTHER PUBLICATIONS

Siva P. Gurrum, et al., "Thermal Issues In Next-Generation Integrated Circuits", IEEE Transactions On Device And Materials Reliability, Dec. 2004, pp. 709-714, vol. 4, No. 4.

(Continued)

*Primary Examiner*—Boris L Chervinsky
(74) *Attorney, Agent, or Firm*—Troutman Sanders LLP; Ryan A. Schneider; James Hunt Yancey, Jr.

(57) ABSTRACT

Nano-scale thermal management devices, methods, and systems are provided. According to some embodiments, a thermal management device configured to remove heat from a heated area can comprise an inlet port and a cavity. The cavity can be positioned intermediate a heat source and an opposing surface spaced apart from the heat source. The inlet port can receive a liquid (such as a coolant or cooling fluid) and direct the liquid to the cavity. The cavity can be configured to control the thickness of the liquid within the cavity. Liquid within the cavity can be heated by the heat source, and the opposing surface can comprise openings to allow evaporated liquid to exit the openings. A gas flow proximate the opposing surface can be used to carry vapor and be used to enhance liquid evaporation. Movement of the evaporated liquid enables heat from the heat source to be removed. The opposing surface can be a perforated membrane having micro-sized and nano-sized perforations. Other embodiments are also claimed and described.

24 Claims, 4 Drawing Sheets

OTHER PUBLICATIONS

Chen Li, and G.P. Peterson, "Evaporation/Boiling in Thin Capillary Wicks (II)—Effects of Volumetric Porosity and Mesh Size", Journal of Heat Transfer, Dec. 2006, pp. 1321-1328, vol. 128.

Chen Li, G.P. Peterson and Yaxiong Wang, "Evaporation/Boiling in Thin Capillary Wicks (1)—Wick Thickness Effects", Journal of Heat Transfer, Dec. 2006, pp. 1312-1319, vol. 128.

Saeed Moghaddam and Michael M. Ohadi, "Effect of Electrode Geometry on Performance of an EHD Thin-Film Evaporator", Journal of Microelectromechanical Systems, Oct. 2005, pp. 978-986, vol. 14, No. 5.

Chen Li and G.P. Peterson, "The Effective Thermal Conductivity of Wire Screen", International Journal of Heat and Mass Transfer, (2006), pp. 4095-4105, vol. 49.

Unsolicited Mar. 31, 2008 Email Transmission from Elson Silva, Ph.D. (Campinas, SP, Brazil) Referencing "issues about fluidic devices in the Patenting System regarding Hydrology Fundamentals".

* cited by examiner

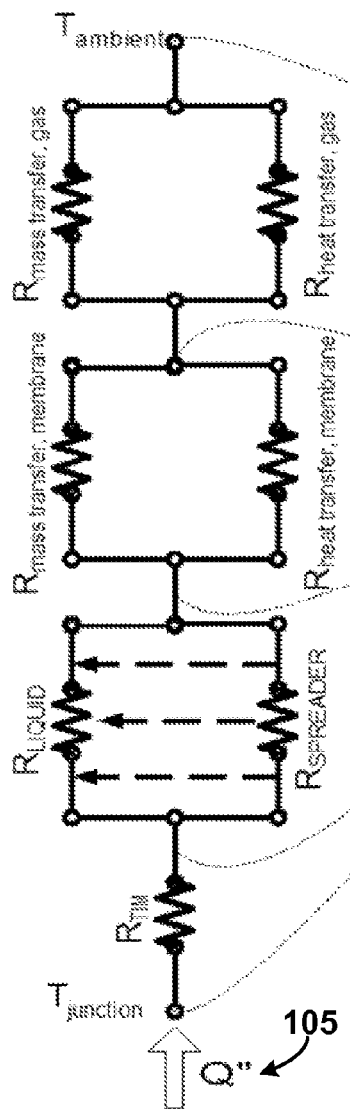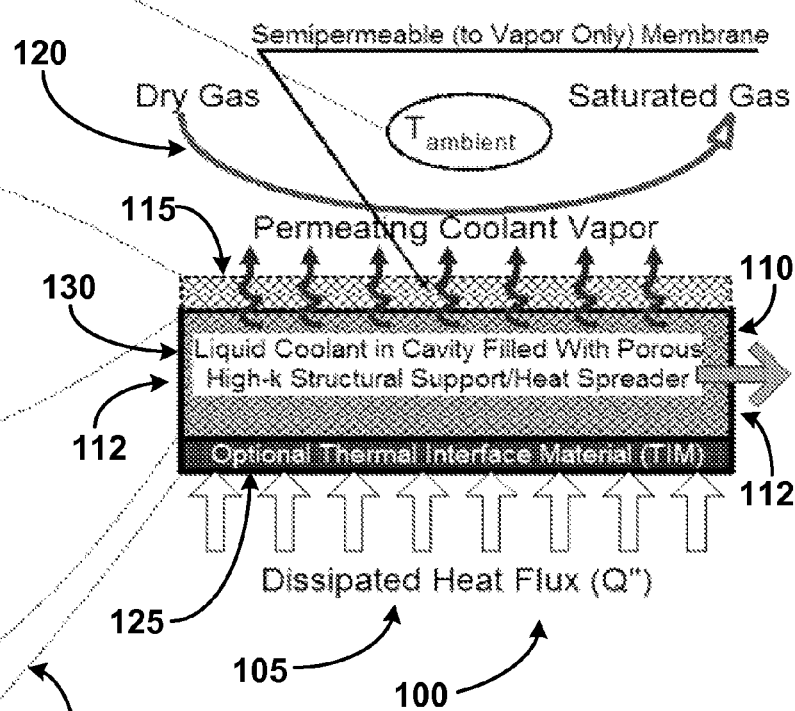
FIG. 1A  FIG. 1B

NANO-PATCH THERMAL MANAGEMENT DEVICES, METHODS, & SYSTEMS

CROSS REFERENCE TO RELATED APPLICATION & PRIORITY CLAIM

This patent application claims priority to and the benefit of U.S. Provisional Application No. 60/800,594 filed on 16 May 2006, and entitled "Perspirating nano-patch for hot spot thermal management," which is hereby incorporated by reference as if fully set forth below in its entirety.

TECHNICAL FIELD

The various embodiments of the present invention relate generally to thermal management devices and techniques, and more particularly, to micro-scale and nano-scale thermal management devices, methods, and systems.

BACKGROUND

Due to the continuing increased density of processing power per size of processing chips, the International Technology Roadmap for Semiconductors (ITRS) predicts that temperature issues associated with chips will continue to increase. Indeed, the ITRS predicts that the allowable maximum power dissipated for high-performance and cost-effective microprocessor units (MPU) is going to increase steadily while chip size will remain constant. The ITRS also predicts a steady decrease in DRAM half-pitch and MPU gate length, along with higher performance of the microprocessors with a steady increase in on-chip and off-chip frequencies. The increase in maximum power density and a decrease in feature size, as predicted by ITRS, results in increased background heat flux (or heat generation) for processing chips and extremely high heat fluxes at hot spot locations where specific concentrations of heat are generated on processing chips.

Excessive heat generation can have undesirable side effects for computer processing chips. Such side effects include inefficient operation which in turn possibly wastes operating power, and processing chip overheating possibly leading to device failure. Another possible problem is unwanted heat generation which can, at times, be uncomfortable or even potentially harmful to an end user.

To address these thermal issues, there are several widely used conventional techniques. Perhaps the most prevalent technique is the use of a radiating heat sink. A heat sink is a heat conducting device (typically made of metal) situated proximate to or in contact with a processing chip that usually has a larger surface area than a chip. The heat sink essentially absorbs heat generated from processing chip and radiates the heat to the surrounding environment as a method of removing heat from the processing chip. Another conventional technique involves the use of a fan. The fan is used to circulate air around a processing chip as a method of removing heat. In certain applications, a fan may be used together with a radiating heat sink.

While serving their respective purposes, these conventional techniques of solving heat problems do posses several drawbacks. One such drawback is the inability to focus in on specific areas of heat generation (or hot spots) occurring on a chip. Similarly, another drawback is that the size of conventional techniques does not enable thermal management at lower scale locations (e.g., micro-scale or nano-scale) using easily controlled techniques. And yet another drawback is the limited magnitude of a heat flux (per unit area) that can be removed using conventional cooling techniques, and thermal problems associated with high performance electronic chips.

Accordingly, there is a need for micro-scale and nano-scale thermal management devices, methods, and systems having improved properties. In addition, there is a need for improved methods of managing thermal loads in hot spot areas (e.g., spatially localized hot spots) of chips and to provide a solution capable of dissipating high fluxes from these hot spot areas without excessive rise in chip junction temperatures. It is to the provision of such micro-scale and nano-scale thermal management devices, methods, and systems that the various embodiments of the present invention are directed.

BRIEF SUMMARY

Various embodiments of the present invention are directed to devices and systems for managing and controlling released thermal-heat energy. According to some embodiments, a thermal management device to remove heat from a heated area generally comprises at least one inlet port, a cavity, and opposing surface. An inlet port can receive a liquid coolant and direct the liquid coolant to a cavity. The cavity can be disposed intermediate a heat source and an opposing surface. The opposing surface can be spaced apart from the heat source and cover at least a portion of the cavity. The cavity can be configured to receive the liquid coolant such that the liquid coolant has a thickness determined by the cavity when the liquid coolant moves into the cavity from the at least one inlet port. When the liquid coolant is in the cavity, the liquid coolant forms a liquid film. The opposing surface can comprise or define a plurality of openings. Thus, the opposing surface can be configured to allow vapor from the liquid coolant heated by the heat source to pass through the openings.

Some embodiments are directed to methods and processes to manage and control thermal energy released at hot spots on a chip. For example, a method to transfer and manage thermal energy released at a heat source can include providing a perforated membrane comprising a plurality of micro-sized and/or nano-sized ("micro/nano" or "micro/nano-size") fabricated perforations and providing a liquid film having a desired thickness and a desired pressure in a cavity. The cavity can be disposed generally between a heat source and the perforated membrane. The perforated membrane can be spaced apart from the heat source such that the cavity is defined between a heat source and the perforated membrane. The method can also include evaporating at least a portion of the liquid film using thermal energy provided by the heat source to form a vapor such that the vapor of the liquid film passes through at least a portion of the perforations. And the method can also include providing a gas flow proximate the perforated membrane to mix with the vapor to form gas-vapor mixture and to carry the vapor in the direction of the gas flow.

Still yet, some embodiments of the present invention include a system to transfer and manage thermal energy released at a hot spot on a surface of a chip. Such a perspirating patch thermal management system can generally comprise a liquid in a cavity, a gas conduit, and a perspirating patch. The cavity can be proximate a hot spot, and configured and shaped to control the thickness of the liquid within the cavity. The liquid is preferably at a temperature lower than the temperature of the hot spot enabling the liquid to absorb heat from the hot spot. The gas conduit can provide a flow of gas proximate the cavity allowing the flow of gas to pass proximate the cavity. The perspirating patch can be disposed in liquid communication with the cavity. The perspirating patch can comprise a plurality of perforated holes to advantageously receive evaporated liquid from the cavity for presentation toward the flow of gas. The flow of gas can carry the evaporated liquid from the perforated holes of the perspirating patch.

Various preferred embodiments of the present can be utilized to remove heat fluxes dissipating at micro/nano-size hot spots on chips. Due to the micro/nano-size embodiments, they can be employed as patches at certain hot-spot locations of a chip to address heat issues at these locations. In addition, multiple patches can be clustered as an array of thermal management devices. Such devices can be operatively coupled with each other via a micro-fluidic network. Thus, it is contemplated that multiple micro/nano-sized management devices, as multiple micro/nano-patches, could be employed in close proximity to each other and on the same chip.

As discussed below in more detail, certain embodiments of the present invention can be implemented as micro/nano-patches. Patches are at times referred to herein as perspiring because embodiments of the present invention advantageously use liquid evaporation and selective transport through a semi-permeable membrane of a patch to manage and remove heat fluxes. Such cooling utilizes phase change (liquid-to-vapor) and heat and mass transfer, and thus has a perspiring effect on a membrane surface of a patch.

Reference is made at times to integrated circuit chips, chips, processing chips, micro processing units, and microprocessors throughout this Specification and times these terms can be used interchangeably. It should be understood, however, that reference to these terms includes various integrated circuit chips including memory devices, processing units (CPU), optical communication devices, and other such devices capable of executing instructions, processing data, or storing or transmitting data.

In addition, reference is also made at time to gas, liquid, fluid, vapor, and other like terms that generally reference material phase conditions. As used herein, the word fluid refers to and includes cooling fluids, coolants, and working coolant fluids. For example, the fluid may be water or a dielectric fluid. Thus, the term fluid is used in a general sense such that a fluid can have a liquid phase (condensed phase), thus forming a liquid coolant, for example. In addition, a fluid can form a vapor (gas phase) in a gas-vapor mixture. The term gas is also used in a general phase-condition sense and can include many gases, such as air, for example. Also, the term carrier gas is at time used herein to refer generally to a gas stream, gas flow, or flow of gas to carry vapor.

Other aspects and features of embodiments of the present invention will become apparent to those of ordinary skill in the art, upon reviewing the following description of specific, exemplary embodiments of the present invention in conjunction with the accompanying figures.

BRIEF DESCRIPTION OF FIGURES

FIG. 1A and FIG. 1B (collectively FIG. 1) illustrate schematic and system diagrams, respectively, related to the underlying concepts of the present invention.

DETAILED DESCRIPTION OF PREFERRED & ALTERNATIVE EMBODIMENTS

Figure 2:
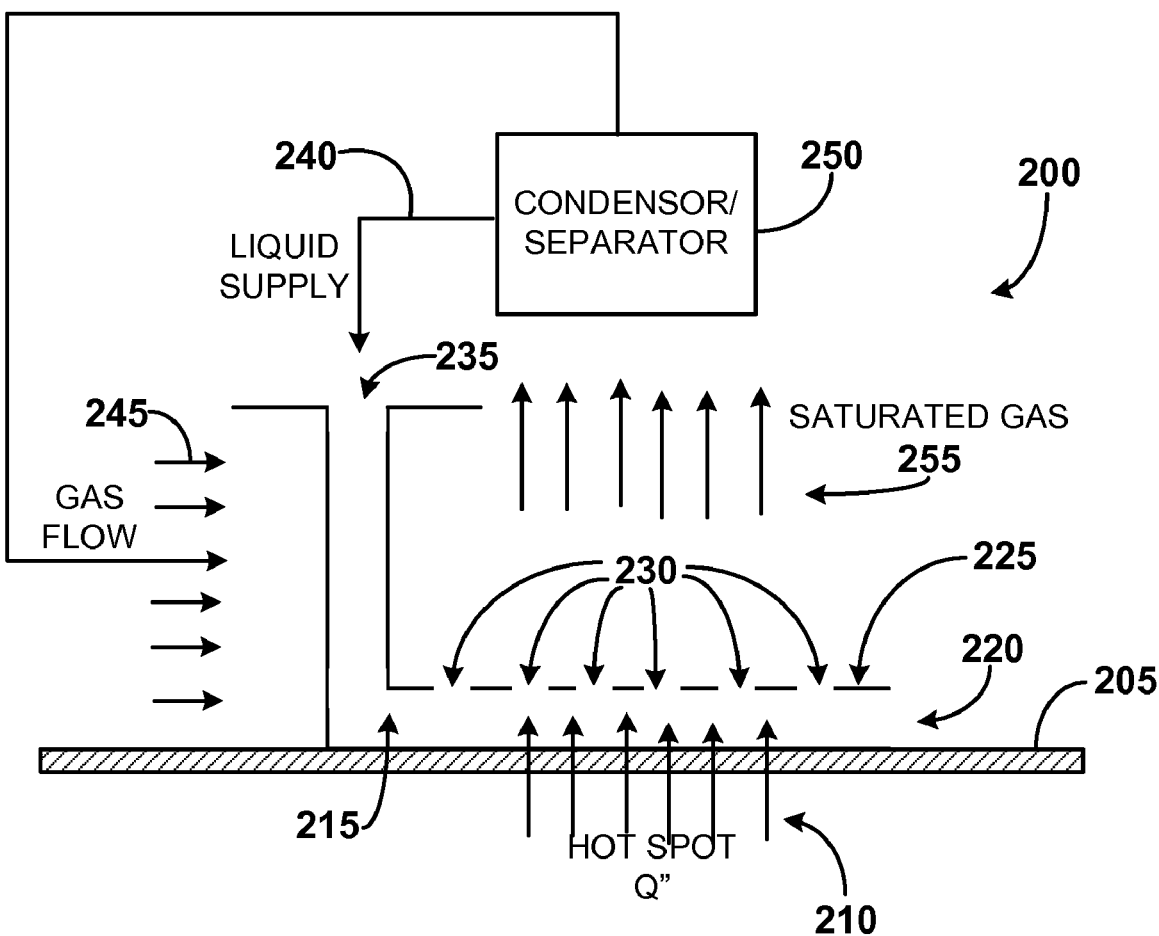
FIG. 2 illustrates a perspective view of a diagram representing a thermal management device according to some embodiments of the present invention.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented.

Phase change heat transfer is an efficient means of heat transfer due to an advantage offered by the significant latent heat of vaporization of liquids. In other words, for example, the amount of energy to convert liquid water to steam (or water vapor) is high thus providing an efficient means of transferring heat between locales. There are two methods to enable phase change heat transfer: boiling and evaporation. A key difference between boiling and evaporation is the location where the phase change (i.e., liquid to gas) occurs.

Assuming normal atmospheric conditions, boiling occurs at a bottom, heated surface beneath a liquid layer. As a result, key factors limiting heat transfer rate for boiling include the rate of bubble nucleation and moving boiling bubbles away from the heated surface. Movement of boiling bubbles is controlled by the hydrodynamics of the boiling process and imposes a hard limit on the maximum heat fluxes that could be achieved via boiling. Indeed, this is known as the Critical Heat Flux (CHF) beyond which boiling becomes unstable and not effective.

As for evaporation, the phase change occurs at the free surface of a liquid film, such as the surface of an exposed container of water. As a result, the rate of heat transfer is controlled by two resistances: (a) conduction/convection across the film; and (b) mass transfer (i.e., for saturated vapor removal) from the evaporation interface to the ambient environment. Since these resistances act to impede evaporation, minimizing both can achieve a high heat transfer rate. The film conduction/convection resistance is controlled by the film thickness such that the thinner the film, the smaller the resistance. Mass transfer resistance for removal of evaporated fluid is controlled by three factors: (1) the mass transfer coefficient (proportional to velocity and flow mode); (2) relative humidity (dryness) of the sweeping gas blown over the film; and (3) saturation density of the liquid which is being evaporated.

Comparing the underlying properties of boiling and evaporation can lead to two observations. First, fundamentally, evaporation may be a much more efficient method of heat removal as compared to boiling if certain conditions are met. Indeed, theoretically, if one can maintain a stable layer of liquid (e.g., substantially constant thickness) on a surface and blow fully dry, sweeping gas (e.g., air) at high velocity above this liquid layer one can dissipate high heat fluxes. Second, volatile fluids such as dielectric liquids (e.g., Fluorinert™ Electronic Liquid FC-72 ("FC-72")) may perform superior to water in evaporation cooling schemes. This is even though thermo-physical properties of water (i.e., thermal conductivity) are much better, but the vapor saturation density is much higher for FC-72 than for water. The opposite is true for boiling heat transfer in which water performs much better, which has been an essential roadblock for using dielectric fluids in boiling thermal management schemes.

At times, the present disclosure discusses water and FC-72 as cooling fluids for use with certain embodiments of the present invention. Embodiments of the present invention are not so limited, however. Indeed, various additional fluids can be used. Additional fluids may include alcohols (e.g., methanol and ethanol) due to very high volatility properties; refrigerants (e.g., R132 and R502) if it is desired to use the described cooling system for refrigeration cooling); and even liquefied gases (e.g., liquid nitrogen, liquid carbon dioxide, or liquid methane, etc.) if cryogenic applications are desired (deep-sub-ambient cooling applications, e.g., 77K for liquid nitrogen at atmospheric pressure).

FIG. 1A and FIG. 1B (collectively FIG. 1) illustrate schematic and system diagrams, respectively, related to the underlying concepts of the present invention. As mentioned above, the rate of heat transfer for evaporation is controlled by the magnitude of the various resistances shown in FIG. 1A, with the following two resistances: (a) conduction/convection across the film; and (b) mass transfer, which is typically more critical to minimize. Performance and operation of various embodiments of the present invention can be understood using a thermal resistance network 100 depicted in FIG. 1A and a corresponding system diagram 150 of FIG. 1B.

As shown in FIGS. 1A and 1B, principles of the embodiments of the present invention can be illustrated as a thermal resistance network. Indeed, FIG. 1A and FIG. 1B illustrate a hot spot 105 (dissipating a heat flux Q") disposed below a liquid film 110, and a membrane 115 located above the liquid film 110. The liquid film 110, as shown, is disposed within a cavity 112. The cavity 112 is generally defined between the hot spot 105 and the membrane 115, and the membrane 115 is spaced apart from the hot spot 105. Also, the cavity 112 is preferably located proximate the hot spot 105. In addition, multiple cavities 112 may be placed proximate multiple hot spots 105 such that as hot spots become active the cavities 112 can remove heat. The multiple cavities 112 can be placed in multiple thermal management devices or the same one. In addition, multiple cavities 112 enable a heat management system to dynamically adjust to a dynamically changing thermal load. The cavity 112 can be a stand alone unit or built on top of a chip. Walls of the cavity 112 can be made with metal, dielectric materials, silicon dioxide, and the like. The cavity 112 walls can be made with a build-up fabrication process.

FIG. 1B also illustrates a gas stream 120 (e.g., air, dry nitrogen, argon, or the like) directed toward the membrane 115. The gas stream 120 preferably evaporates liquid from the liquid film 110 that passes through the membrane 115. In addition, the hot spot 105 preferably dissipates heat to the cavity 112 thereby warming the liquid film 110. As the liquid film 110 warms within the cavity 112, it moves towards the membrane 115 to pass through the membrane 115. As the gas stream 120 flows over the exposed surface of the membrane (i.e., the membrane surface not disposed toward the cavity 112), the gas stream 120 evaporates the liquid to produce a coolant vapor.

FIG. 1B also illustrates optional features that may be used in alternative embodiments of the present invention. These features include a thermal interface material ("TIM") 125 and a heat spreader 130. As shown, the TIM 125 can be disposed toward the hot spot and serve as an interface between the hot spot 105 and the cavity 112 of the thermal management system to ensure thermal-efficient (i.e., low thermal resistance coupling) between the hot spot 105 and the liquid film 110. Yet, the TIM 125 can prevent direct and potentially detrimental for performance exposure of the electronic component to the coolant. The TIM 125 can be made from existing TIM materials known in the art. Also, the TIM 125 can be integrated with or form a bottom wall of the cavity 112.

The heat spreader 130 can also be used in some embodiments. The heat spreader 130 can be made from a porous material and disposed within the cavity 112 in the liquid film 110. In other words, the heat spreader can be submerged within the liquid film 110 and be porous enabling the liquid film 110 to move within the cavity 112. Indeed, the heat spreader 130 is preferably a high thermal conductivity porous structure submerged into the liquid film 112. This advantageous configuration enables the heat spreader 130 to support the membrane 115 for structural integrity and spreads heat to further minimize the thermal resistance of the liquid film 112.

FIG. 1A illustrates various thermal resistances discussed above. These resistances include:

(A) $R_{TIM}$ is thermal resistance of an optional thermal interface material 125 ("TIM") that can be disposed toward a heat source (e.g., computer chip) to transfer heat to the cavity 112. Use of a TIM 125 is optional and can be used with alternative embodiments of the present invention. It may be less desirable to use a TIM 125 when dielectric coolants are used in direct contact with electronic components.

(B) $R_{LIQUID}$ is thermal resistance due to convection (when film is moving) or conduction (when film is stagnant/stationary) of the liquid 110 confined in the cavity 112.

(C) $R_{SPREADER}$ is thermal resistance due to the conduction through an optional heat spreader/porous structure 130 supporting the cavity 112 and submerged into the liquid 110. The porous structure 130 should be made from the highest possible thermal conductivity material (e.g., copper or aluminum or silicon or diamond, etc.) to minimize its thermal resistance.

(D) $R_{mass\ transfer,\ membrane}$ is thermal resistance due to mass transfer of evaporated liquid 110 (i.e., in a vapor phase) across the membrane 115 which bounds the cavity 112 to confine the liquid 110. This resistance can be minimized by making the membrane 115 thin, yet capable of withstanding pressure difference between the liquid 110 inside the cavity 112 and ambient pressure outside the cavity 112 to avoid liquid leakage and membrane 115 structural failure.

(E) $R_{hear\ transfer,\ membrane}$ is thermal resistance due to heat transfer across the membrane 115 which bounds the cavity 112 to confine the liquid 110 (mainly by heat conduction through the solid constituents of the membrane). This resistance can be minimized by making the membrane 115 from a material with a high thermal conductivity and thin, yet capable of withstanding pressure difference between the liquid 110 inside the cavity 112 and ambient pressure outside the cavity 112 to avoid liquid leakage and membrane 115 structural failure.

(F) $R_{mass\ transfer,\ gas}$ is thermal resistance due to mass transfer of evaporated liquid 110 (i.e., in a vapor phase) from the exposed to ambient surface of the membrane 115 to the ultimate ambient where heat rejection occurs. This transport is enabled by moving dry gas (air or nitrogen or others) with high velocity towards (a gas stream 120) and along the surface of the membrane 115, resulting in a vapor sweeping action. Thus, this resistance can be minimized by proper orientation of a gas jet/flow relative to the membrane to minimize the solutal boundary layer thickness, moving gas at high speed to increase mass transfer coefficient, and using gas in its fully "dry" (i.e., unsaturated with the vapor molecules of the specific cooling substance used) state to enhance its vapor storage capacity.

(G) $R_{hear\ transfer,\ gas}$ is thermal resistance due to convective heat transfer from the exposed surface of the membrane 115 to the blowing gas stream 120. This resistance can be minimized by proper orientation of a gas jet/flow relative to the membrane 115 to minimize the thermal boundary layer thickness, moving gas at high speed to increase heat transfer coefficient, and using the gas with highest possible thermal conductivity.

As mentioned above, evaporative cooling can be beneficial under certain circumstances. Embodiments of the present invention are directed at minimizing the above mentioned thermal resistances to obtain such circumstances. Transferring heat away from the hot spot 105 essentially involves the fluid film 110 within the cavity 112 absorbing heat from the hot spot 105, moving heat across the cavity 112 by liquid convection/conduction (and optionally, in combination with conduction through the porous spreader 130), and then transferring heat to the air stream 120 via liquid coolant evaporation through the membrane 115.

FIG. 2 illustrates a perspective view of a diagram representing a thermal management device 200 according to some embodiments of the present invention. As shown, the device 200 generally comprises a surface 205 having a hot spot 210 location. The surface 205 can be a surface of a processing chip and the hot spot 210 may be a portion of the surface 205 where a processing chip emits a high heat flux. The high heat flux may be caused by a concentration of internal processing components that are processing data such that a locally significant electric current (data transmission) in the area of the hot spot 210 causes the chip to dissipate a high heat flux relative to other portions of the processing chip. The hot spot 210 area on a processing chip may include a surface area ranging from approximately 50 nm by approximately 50 nm to approximately 1 cm by approximately 1 cm. As described below in more detail, the thermal management device 200 is advantageously positioned and configured to remove and manage a high heat flux at hot spot 210 thereby enabling efficient chip performance.

To manage a high heat flux at hot spot 210, the thermal management device 200 also preferably comprises additional components. For example, the thermal management device 200 can comprise a fluid inlet 215, a cavity 220, and an opposing surface 225. The opposing surface 225 is preferably spaced apart from the hot spot 210 to define the cavity 220. As shown, the cavity 220 is positioned proximate the fluid inlet 215 and below the opposing surface 225 such that the cavity 220 is disposed intermediate the hot spot 210 and the opposing surface 225. The opposing surface 225 preferably has a number of openings 230 (such as apertures, holes, or perforations) at various locations. The fluid inlet 215 preferably serves as an input to direct liquid from a liquid conduit 235 into the cavity 220.

Other features of the thermal management device 200 can also include a liquid supply 240, a gas flow 245, and a condenser/separator 250. The condenser/separator 250 is preferably configured to provide the liquid supply 240 and may also provide the gas flow 245, which can then be directed toward the cavity 220. The gas flow 245 can be directed at varying angles to the opposing surface, ranging from parallel to perpendicular directions. The condenser/separator 250 is also preferably configured and positioned to receive a saturated gas flow 255. The saturated gas flow 255 contains a high concentration of an evaporated liquid coolant leaving the cavity 220 and gas from the gas flow 255. The condenser/separator 250 can receive the saturated gas flow 255 and separate coolant fluid from gas by condensation of the vapor or by other means including, but not limited to, membrane separation and adsorption. The condenser/separator 250 can also provide the condensed, separated liquid coolant for recirculation using liquid conduit 235. For example, upon leaving the condenser/separator 250, a liquid supply 240 can be pumped to the fluid conduit 235, and dry, de-vaporized gas can be used as the gas flow 245 and propelled by a fan or compressor toward the opposing surface 225.

A challenge with evaporative cooling is maintaining a stable liquid film (e.g., thin liquid film) on a surface which is being cooled. As discussed above, with reference to FIG. 1, maintaining such a film as thin as possible reduces the film's thermal resistance thereby increasing efficiency of thermal management and avoiding local dry-out resulting in a temperature increase and device failure. As discussed herein, providing a thin, stable liquid film that substantially covers a hot spot area in substantially constant fashion are advantageous features of embodiments of the present invention. Indeed, when a dry spot is formed in a liquid film, where liquid is fully evaporated and not replenished, this dry spot condition typically leads to a decrease in the heat transfer coefficient, an increase in the surface temperature, and decreased performance of the cooling system.

The various embodiments of the present invention advantageously address dry spot conditions with several advantageous features. As shown in FIG. 2, when fluid from the fluid supply 240 enters the fluid conduit 235 and is directed toward the cavity 220 through the inlet 215, the cavity 220 controls the fluid with its geometrical shape. In other words, the cavity 220 is configured to control the fluid to have a thickness conforming to the size the cavity and fluid within the cavity 220 forms a fluid film without dry patches. The geometrical shape (e.g., height, width, and internal volume) of the cavity 220 can be varied to produce a liquid film having desired characteristics.

To maintain a stable liquid film of a small, controllable thickness, embodiments of the present invention provide a fluid into the cavity 220. The cavity 220 is preferably, but not necessarily always, a microfabricated cavity (slit) of a designed shape and size. For example, but not limitation, the cavity 220 height can range from approximately 10 nanometers to approximately 10 micrometers, and even up to approximately 1 millimeter in embodiments. The cavity spatial extent (width) can vary between approximately 50 nm to approximately 10-100 micrometers and up to approximately 1-10 mm. As such, the fluid film's geometrical dimensions (e.g., thickness and width) are imposed by the cavity's 200 structure and dimensions, rather than by fluid flow conditions. Advantageously, this configuration can dictate the thickness of the fluid film with a high degree of control, minimize conduction/convection resistance, and reduce dry spot possibility since sufficient pressure to fill the cavity with the fluid is maintained.

Another advantageous feature used to allow coolant evaporation and to prevent dry spot conditions involves the use of surface perforations. Indeed, one or more surfaces of the cavity 220 may comprise perforations 230 (or openings). For example, the opposing surface 225 can comprise a plurality of openings 230 that have a predetermined size and geometry, as well as coated with a material having desired surface properties. The openings 230 can have sizes on the micrometer and nanometer scales, may be configured in a form of straight aligned channels or a network of pores, for example. The perforations 230 can also be configured as a dense array of holes in a thin solid wall or a micro/nano-porous membrane. The perforations 230 provide a route for evaporating vapor from the liquid film to escape into ambience or a gas flow 245.

The perforated opposing surface 225 can also be configured to enable fluid to pass through the openings 230 in a controlled manner. According to some preferred embodiments, the opposing surface 225 is semi-permeable allowing only vapor (volatile phase) of a coolant to escape, while confining liquid (condensed phase) within the cavity by using capillary and viscous forces acting on the liquid in contact with the perforated surface. The magnitude of these forces is defined by the size (diameter and length) of the pores/holes in the membrane, the geometry of the pore/hole defining orifices (e.g., sharp edges vs. dull edges), the number density of holes per unit area, and the nature of the membrane material or the coating applied to the surface of the pores/holes. For example, having smaller diameter holes with sharp orifice edges and with the liquid-phobic (hydrophobic in case of water as a coolant) overcoat would maximize the surface tension which prevents the liquid leaks from the confines of the cavity 220 through the openings 230 to ambient (external to the cavity 220) environment. Such a configuration advantageously maintains the liquid film fully filling the entire volume within the cavity 220 and replenishes the cavity with the liquid as coolant vapor leaves the cavity 220 through the openings 230 of the opposing surface 225 due to evaporation. In some preferred embodiments, no liquid leaks occur across the membrane (perforated surface 225) and only vapor passes through the holes 230. In other preferred embodiments, however, liquid leakage at a controlled rate can occur across the perforated surface 225 without negative impact on the cooling system performance.

By utilizing capillary forces acting on fluid at the openings 230 the evaporation rate of the fluid can be controlled. The capillary forces support pressure differences between the fluid inside the cavity 220 and atmospheric pressure outside (ambience) through the openings 230. Because the capillary forces acting on the fluid at the openings 230 are inversely proportional to the radius of the openings 230, the capillary forces have adequate magnitude to control release of the fluid from the openings 230 thereby maintaining fluid within the cavity 220 to address dry spot conditions. As an example, when FC-72 is used as a fluid and the perforations 230 have a diameter of approximately 100 nm (which can be readily fabricated using nanoimprinting, E-Beam/FIB, dry or wet etching of silicon, or other microfabrication techniques in a variety of materials), the perforations 230 can support more than one atmosphere of pressure difference across the perforated surface 225. This pressure difference is even higher for water as a coolant fluid due to water's larger surface tension relative to FC-72.

The capillary forces can be further enhanced or controlled according to some embodiments of the present invention. Indeed, altering surface properties of the openings with selective chemical functionalization on the inner perforated surface that contacts the fluid maintained within the cavity can enhance or change the capillary force dynamics. For example, a hydrophobic coating can be applied inside on the inner surface of the perforated holes. Another example includes structural modification of the inner surface of the pores/holes 230 in the membrane 225 by imposing nano-scale roughness (i.e., making a superhydrophobic surface) in order to control the contact angle between the liquid coolant and the pore surface.

According to still yet other alternative embodiments, conductive materials can be disposed within the cavity. For example, carbon nanotubes or a porous material (e.g., see heat spreader 130 in FIG. 1) can be disposed within the cavity. The porous material can provide structural support for the membrane and act as a heat spreader to enhance the effective contact surface area between the liquid and the hot spot. In some embodiments, the porous material can be sufficiently strong mechanically and have high thermal conductivity to enable efficient conduction heat transfer and utilize materials such as copper, aluminum, silicon, diamond, and thermally conducting polymers. By using such conductive materials, heat from a heat source can advantageously be moved toward the opposing surface 225 at a high rate.

Figure 3:
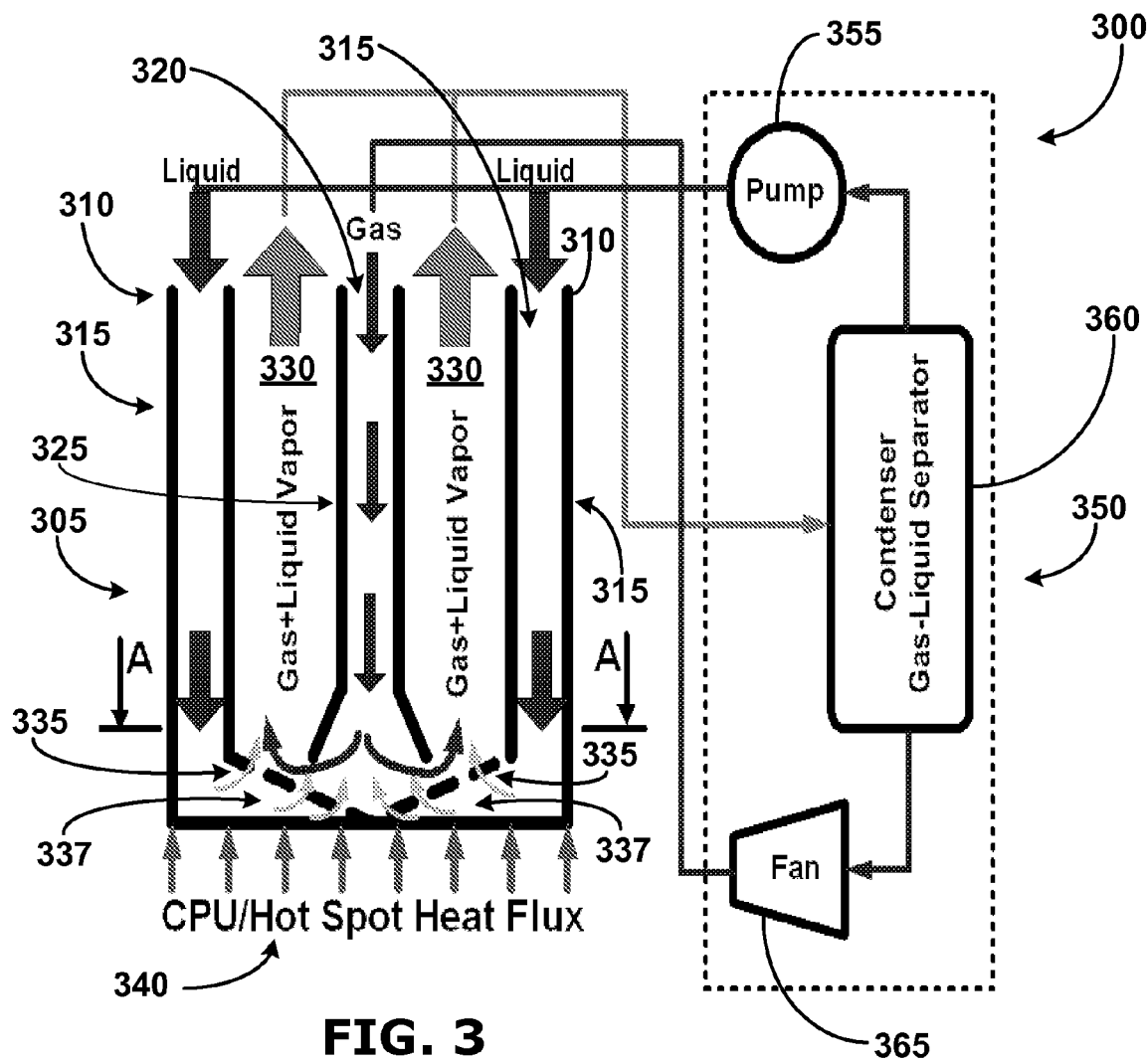
FIG. 3 illustrates a perspective view of a diagram representing a thermal management system according to some embodiments of the present invention.

FIG. 3 illustrates a perspective view of a diagram representing a thermal management system 300 according to some embodiments of the present invention. As shown, the system 300 generally comprises an internal set 305 of components and an external set 350 of components. Also as illustrated, the components of the sets 305 and 350 can be connected fluidically via conduits or pipes. Such conduits can be micromachined, metal, plastic, and vary according to implementation details. In addition, the conduits can be made within layers of a chip during a build-up fabrication process.

The positioning of the component sets 305, 350 can vary according to the various embodiments of the present invention. As an example, the internal set 305 of components can be provided within computer processing equipment, such as a computer, proximate a processing chip (not shown). As another example, the external set 350 of components can be provided on the exterior of computer processing equipment. In other words, a portion of the thermal management system 300 may be situated on the outside of electronic equipment while another portion may be situated within the same electronic equipment. It should be understood, however, that all of the system 300 may be situated within electronic equipment. It also should be understood that computer processing equipment may include any apparatus, device, or system comprising one or more processing chips that may emit heat. Further, in some embodiments, the internal set of components 305 can be operated without use of the external set of components 350 in an open-loop system.

The components of the internal component set 305 of the system 300 can be situated near a processing chip (not shown) as a cooling device to remove or manage heat dissipated (e.g., a heat flux) by the processing chip. For example, and according to some preferred embodiments, the internal set 305 of components are situated proximate a hot spot of a processing chip to remove heat fluxes occurring at the hot spot. As shown, the internal set 305 of components generally includes a liquid input 310, a liquid conduit 315, a gas input 320, a gas conduit 325, a vapor exhaust conduit 330, and a perforated membrane 335. The perforated membrane 335 can be situated above a hot spot 340 that is dissipating a heat flux. Also, and as shown, the perspirating membrane 335 can have at least one tapered surface such that a portion of the flow of gas contacts the tapered surface at an angle. As shown, a cavity 337 to confine a fluid film is generally defined between the perforated membrane 335 and the hot spot 340.

The internal component set 305 can all interact together to remove heat energy from the hot spot 340 using evaporative techniques discussed herein. Indeed, the liquid conduit 315 can direct liquid toward the hot spot 340 such that the liquid comes into close proximity, either direct contact or indirect contact (e.g., see the TIM 125 of FIG. 1), with the hot spot 340. The provided liquid preferably has a lower temperature than the hot spot 340 to absorb heat energy from the hot spot 340. As the liquid absorbs heat energy from the hot spot 340 causing the temperature of the liquid to rise and transfer the heat from the hot spot to the liquid surface in contact with the perforated membrane 335 by conduction and convection. This heat is used to induce phase change of a coolant from liquid to vapor by evaporation, and generated vapor is then removed from within the membrane 335 to the ambient environment by convective heat and mass transfer associated with the sweeping carrier gas 330.

As shown, a flowing stream of gas is directed toward the perforated membrane 335 by the gas conduit 320. The gas conduit 320 can be configured as a jet with an exhaust disposed toward and at a desired impingement angle to the perforated membrane 335. The gas conduit 320 can include one or more individual input and output conduits Preferably the flowing stream of gas is at the same temperature of slightly warmer than the liquid and is flowing at a high velocity to increase rates of vapor removal and prevent vapor condensation when it contacts with the gas. Sample liquid temperatures can range from 70 K to 140 K for cryogenic applications with liquid nitrogen and methane as coolants; 140 K to 300 K for refrigeration applications with liquid refrigerants as coolants; and 300 K to 350 K for cooling conventional microprocessors using water and fluorocarbon coolants at atmospheric conditions. Higher fluid temperatures are also possible in applications of cooling high temperature electronics. Sample gas flow velocities can range from a few (e.g., 1-5) meters per second for gas flow induced by conventional fans up to 300 m/s or even higher for gas flow created by a compressor or other high pressure sources.

As the flowing stream of gas contacts exposed liquid on the surface of the perforated membrane 335, the flowing gas carries away vapor molecules of the evaporated coolant, thus promoting further evaporation from the liquid interface. In doing so, the flowing gas in combination with liquid confined in the cavity 337 transfers thermal energy from the hot spot 340 to the ambient environment, thereby managing heat dissipated from the hot spot.

Other features can be incorporated into the internal set of components 305. For example, one can array multiple sets of internal component sets 305 to cover larger surface areas or multiple hot spots. In such an embodiment, a single condenser/separator 355 can be used with multiple internal component sets (cooling devices) 305. Also, the internal set of components 305, as a cooling device, can be self-controlled. Since fluid is pressurized inside the cavity 337, as soon as the heat load increases, it results in greater rates of evaporation. This configuration reduces liquid pressure inside cavity and, in turn, promotes an increase in the liquid intake into the cavity via a self-pumping action. In doing so, this advantageous configuration automatically adjusts for change in a heat load without using any external control system to monitor the heat load and adjust operating conditions of the cooling system.

Now turning to the external set 350 of components of the system 300, the external set 350 of components generally include a pump 355, a condenser 360, and a fan 365. Each of these components can interact with each other to receive a vapor-gas mixture stream from the internal set 305 of components and to provide a liquid supply and a gas supply to the internal set 305 of components. Indeed, the separator 360 receives the mixture of gas and coolant vapor from the internal component set 305 and separates the vapor into a liquid and a gas using one of numerous possible separation techniques (e.g., using membranes, adsorption, and others). The condenser 360 then receives a coolant vapor stream and converts it back into a liquid phase to supply to the internal component set 305. In some embodiments the separator and condenser are combined into a single unit 360 if the saturation temperatures of the carrier gas and a coolant are substantially different. This enables one to effectively carry the coolant vapor-carrier gas mixture separation by condensation of the least volatile substance (in a typical embodiment, the coolant such as water or a fluorocarbon is being condensed). In other embodiments, the condenser/separator 360 can be a separate individual unit used solely for coolant vapor condensation.

The liquid can then be provided to the pump 355 to be pumped to the coolant input 310 into the liquid conduit 325 and then into the cavity 337. Also, the fan or the compressor 365 provides a gas stream to the gas input 320 into the gas conduit 325. As the gas stream flows from the gas conduit 325 to the vapor exhaust conduit 330, liquid coolant evaporated through the perforated membrane 335 interacts with the gas stream to form a mixture of gas and coolant vapor. Due to the force of the fan or compressor 365 providing the gas stream, the vapor-gas mixture then travels to the separator-condenser 360 where the mixture is separated and condensed to form two separate streams of the liquid coolant and a carrier gas for return to the internal set 305 of components.

As can be seen, the thermal management system 300 is a closed-loop thermal management system capable of removing heat from a hot spot and then recycling the liquid coolant. Such a closed-loop system enables use of coolants needing to be used in a closed environment according to some embodiments. It should be understood, however, that the thermal system 300 does not have to be a closed-loop system according to certain other embodiments.

Indeed, and as mentioned above, the thermal system 300 need not include an external component set 350. Thus, in some embodiments, the system 300 may operate without a separator/condenser in an open loop. Preferably, open loop configurations are only utilized with coolants and gases that are safe, benign substances. As an example, water can be used as a coolant and dry air as a carrier gas. In this configuration, liquid coolant (water) can be stored in an on board container and supplied to a cavity of a nano-patch device. The gas, dry air, can be taken from the atmosphere, dehumidified, and directed towards the nano-patch to enable evaporation of water vapor from the nano-patch's exposed surface resulting in evaporative cooling. The saturated air with water vapor (moist/saturated vapor) can then be exhausted to the ambient atmosphere without additional equipment. Such an open-loop system, while requiring periodic water replenishment, can utilize ambient air without needing storage for gas.

The thermal management system 300 may also have other advantageous features. For example, to facilitate use of the evaporative cooling techniques described herein, the thermal management system 300 can provide a high speed flow of gas and pump a coolant fluid at such a pressure that maintains a small layer of liquid within the cavity. For example, the thermal management system 300 can advantageously provide a high speed gas flow stream having a velocity ranging from approximately 1-10 m/s to approximately 150-300 m/s to enable high rates of mass transfer from the evaporating surface (to minimize mass transfer resistance). As another example, the thermal management system 300 can advantageously induce a pressure head (in excess of ambient environment pressure) ranging from $10^{-3}$ bars to 100 bars to supply the liquid coolant into the cavities of different sizes and for different evaporation rates depending on the heat dissipation from the hot spots and a number of active hot spots.

Figure 4:
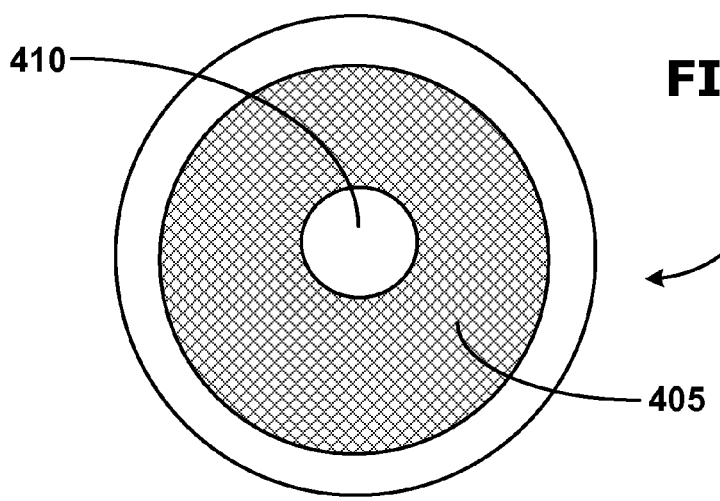
FIG. 4 illustrates a cross-sectional view of a perspirating nano-patch for use in thermal management system, such as the thermal management system depicted in FIG. 3.

FIG. 4 illustrates a cross-sectional view of a perspirating nano-patch 400 for use in thermal management system, such as the system depicted in FIG. 3. The nano-patch 400, for example, can be utilized as the perforated membrane 335 discussed in the thermal management system 300. Indeed, the nano-patch 400 can illustrate a cross-sectional view of the perforated membrane 335 taken from the line A-A of FIG. 3.

As shown in FIG. 4, the nano-patch 400 can comprise a perforated area 405. The perforated area 405 can define a plurality of openings forming a semi-permeable membrane (nano-patch) 400. Preferably the openings extend through the membrane thereby providing numerous apertures extending from a top surface of the nano-patch 400 to a bottom surface of the nano-patch 400. The apertures can serve as conduits for fluid to pass through the nano-patch 400 thereby enabling evaporative cooling techniques taught herein to occur. Also, the openings of the nano-patch 400 can have a tapered shape such that the diameter of the openings disposed toward a cavity are greater than the diameter of the holes disposed toward a flow of gas. The perforated area 405 can also be configured to have semipermeable properties. Such a semipermeable membrane enables vapor to pass through the nano-patch 400 but not liquid.

The plurality of openings forming the perforated area 405 can be positioned in various configurations according to embodiments of the present invention. Indeed, while illustrated as a single area in FIG. 4, the perforated area 405 may include multiple distinct perforated regions with different sizes and number density of the openings/holes. The multiple distinct perforated regions may be positioned on certain predetermined areas of a nano-patch 400 and the multiple regions together enable fluid to pass through the nano patch 400 in a form of vapor to cause a perspiring effect and thus efficient phase-change evaporation cooling.

In addition, the perforated area 405 may enclose one or more non-perforated areas. For example, the perforated area 405 may enclose an aperture 410 to enable the nano-patch 400 to be used in the thermal management system 300. Indeed, the aperture 410 provides an opening for the gas conduit 325 to pass through the nano-patch 400 to provide a gas stream 320 proximate the nano-patch 400.

The nano-patch 400 can have various physical properties relating to its size. For example, and as shown, the nano-patch 400 can have a general disc-shape. The nano-patch 400 can also have other geometric shapes, including but not limited to, square, oval, linear, or other polygonal shapes. The exact surface area of the nano-patch 400 may vary according to implementation details. Exemplary surface areas may range from 100 square micrometers to 100 square millimeters. The nano-patch 400 can have varying widths ranging from 50 nm to 10 mm, and in addition, the nano-patch 400 may have various lengths ranging from 50 nm to 10 mm. Preferably, the nano-patch 400 is configured and sized to be disposed atop a cavity to enable fluid to pass through the cavity thereby enabling evaporative cooling.

The construction and fabrication of the nano-patch 400 and the perforated area 405 can also have various characteristics. For example, the nano-patch 400 can be made of metal and metal oxides (copper, aluminum, aluminum oxide, etc), semiconductors and dielectric materials typically used in integrated circuit manufacturing (e.g., silicon, silicon oxide, silicon nitride, silicon carbide, quartz, etc), polymers and plastics (e.g., polyamide, etc.), and various composite materials. As for the perforated area 405, it can be formed into the nano-patch by electrochemical and chemical etching (dry or wet), nanoimprinting, mechanical stamping, using sacrificial structures defining the holes combined with overcoating by structural materials, laser drilling, electron beam and focused ion beam machining, among others. The membranes could also be made by molecular self-assembly, followed by curing or cross-linking of the material or overcoat deposition to achieve desired mechanical and chemical properties.

Once the perforated area 405 is formed to include a plurality of apertures extending through the nano-patch 400, the apertures can be adjusted to control capillary forces associated with the apertures. For example, a coolant fluid-phobic (i.e., hydrophobic in the case of water as a coolant) coating can be applied inside on the inner surface of the holes (parylene C, for example, can be deposited to form a conformal coating which is hydrophobic). Another example includes structural modification of the inner surface of the pores/holes in the membrane by imposing nano-scale roughness (i.e., creating a superhydrophobic surface modification) in order to control the contact angle between the liquid coolant and the pore surface.

Figure 5:
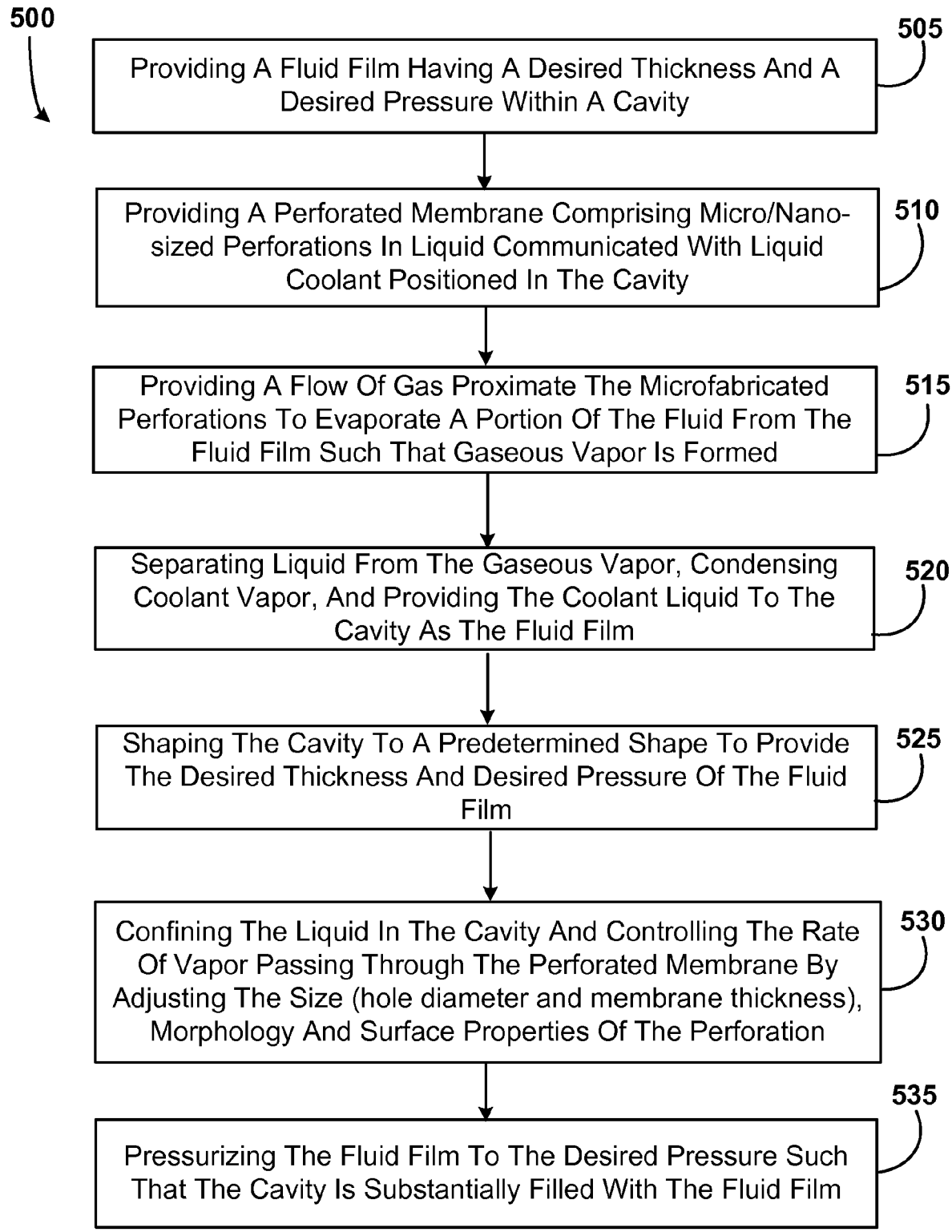
FIG. 5 illustrates a logical flow block diagram of a method for removing and managing thermal energy dissipated from a hot spot to an ambient environment according to some embodiments of the present invention.

FIG. 5 illustrates a logical flow block diagram of a method 500 for removing and managing thermal energy (heat) from a hot spot according to some embodiments of the present invention. It should be understood that the method 500 is only one method embodiment of the present invention and that the method 500 can have various additional features or be performed in various orders.

The method 500 can initiate at 505 by providing a fluid film having a desired thickness and a desired pressure within a cavity. The cavity can be disposed proximate a heat source. Preferably, the size of the cavity confines the fluid film and as such determines the thickness of the fluid film. The fluid film can result from fluid being provided into the cavity from an inlet. The cavity can also have various shapes including, but not limited to, circular, linear, square, polygonal, etc., and may have constant height, variable height, or tapered height (i.e., reduced height) in the direction of the liquid flow.

At 510, the method can continue by providing a perforated membrane. The perforated membrane can comprise a plurality of micro/nano-scale holes/pores in communication with liquid coolant in the cavity. The perforations are preferably small apertures formed in the membrane extending between the top and bottom surfaces of the perforated membrane. The apertures can be micro/nano-fabricated according to some embodiments. In addition, the apertures can have varying sizes; preferably, however, the apertures have small diameters ranging from approximately 10 nanometers to approximately 10,000 nanometers. Such an advantageous configuration enables vapor evaporating from the liquid film interface to pass through perforations, while keeping the liquid confined within the cavity and substantially filling the cavity in a substantially constant fashion.

The method 500 can continue by providing a flow of gas proximate the plurality of micro/nano-fabricated perforations at 515. Indeed, preferably the micro/nano-fabricated membrane is positioned within the gas flow so that the flow of gas directly contacts the perforated membrane. This advantageous configuration enables the flow of gas to effectively remove the coolant vapor molecules passing through the perforated membrane. As evaporation occurs, the flowing gas and coolant vapor combine thereby yielding a vapor-saturated gas mixture. Due to the large amount of energy consumed due to evaporation of the liquid the heat energy absorbed by the liquid coolant from a hot spot is moved away from the hot spot.

The method 500 can also include removing liquid from the gas-vapor mixture and providing the liquid to the cavity as the liquid film at 520. According to some embodiments, the carrier gas-coolant vapor mixture can be directed or provided to a separation unit and a condenser with a conduit. The condenser is preferably configured to receive the gas-vapor mixture and separate it into carrier gas and liquid coolant. Those skilled in the art will understand condensation processes for various liquids, and thus for brevity, condensation details are not discussed at length herein. In some embodiments, adsorption and membrane separation can be used for condensation purposes.

The location and positioning of a condenser may vary according to various embodiments of the present invention. Indeed, according to some embodiments, a condenser can be situated relatively proximate a hot spot and a thermal management device disposed next to the hot spot. For example, the condenser may be located within a housing that houses a chip having the hot spot. Alternatively, the condenser may be located exterior to a housing that contains a chip having the hot spot. Still yet, a condenser may not be utilized in open-loop configurations.

A method embodiment according to the present invention may also include features relating to physical properties of components within a thermal management device. For example, and as shown in FIG. 5, the thermal management method 500 can include shaping a cavity to a predetermined geometrical shape at 525. Advantageously this shaping feature enables providing a desired thickness and desired pressure of the fluid film. By doing so, it is possible to control the rate of evaporation and to effectively avoid possible dry spot conditions that can detract from the cooling abilities of evaporative cooling. In addition, the thermal management method 500 can include controlling the rate of fluid passing through the perforated membrane 530. As an alternative or additional control mechanism, adjusting the size and number density of the micro/nano-fabricated holes/pores in the perforated membrane can also control the rate of evaporation and to effectively address possible dry spot conditions. Thus, adjusting various physical properties of components enables control over evaporative cooling.

The thermal management method can also include additional features. As an example, the method can include pressurizing a fluid film to a desired pressure at 535. By regulating or controlling the pressure of fluid supplied to the cavity of a thermal management device, it is possible to ensure that the cavity is substantially filled with the fluid film. This also addresses possible dry spot conditions. In some embodiments of the present invention, it may be desirable to reduce the pressure associated with a liquid flow before being provided to a cavity. Such reduction in pressure ensures that the pressure of a fluid film in a cavity does not overcome capillary forces of a perforated membrane in such a manner that may cause a liquid leak. Alternatively in other embodiments it may be desirable to increase the pressure associated with a liquid flow before being provided to a cavity. As an example, due to placement and positioning of a condenser relative to a cavity, an increase of pressure may be necessary to ensure proper operation of a thermal management system.

Still yet, the thermal management method can include other features. For example, it may desirable to utilize a second fluid for additional or supplemental cooling. Thus, the method 500 may also include providing a second fluid proximate to another fluid film and/or a heat source. By providing a second fluid close to another fluid film and/or the heat source, the second fluid can enable additional cooling effects. It is also contemplated that additional cooling fluid flows can also be utilized. A second or additional fluid used as a coolant is preferably contained within its own conduit system so as not to directly interact with the first fluid but rather be configured to enable a heat exchange to occur between the fluids. As another example, it may be desirable to use multiple gas flows. Use of multiple gas streams of the same or different gases with one or more inlets and exits may be used to control the rate of heat transfer from different sub-domains of the system.

In addition to providing multiple fluid flows, the thermal management method 500 may comprise regulating or varying the flow of a gas stream. For example, the method 500 may include providing the flow of gas at a velocity ranging from approximately 1 meter per second to 10 meters per second to approximately 100 meters per second to 300 meters per second to control evaporation of the fluid film from the cavity. While other flow rates are contemplated, these specific flow rates are advantageous since by providing a gas flow within these ranges it is possible to enable efficient evaporation control thereby providing continued cooling. In addition, the method 500 can include at least one of drying or heating at least a portion of gas in the gas flow to enhance evaporation of the liquid film.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

I claim:

1. A thermal management device to remove heat from a heated area, the thermal management device comprising:
   at least one inlet port to receive a liquid coolant and direct the liquid coolant to a cavity, the cavity disposed intermediate a heat source and an opposing surface, the opposing surface covering at least a portion of the cavity;
   the cavity configured to receive the liquid coolant such that the liquid coolant has a thickness determined by the cavity when the liquid coolant moves into the cavity from the at least one inlet port, the liquid coolant within the cavity forming a liquid layer having a geometrical shape corresponding to the shape of the cavity;
   the opposing surface comprising a plurality of openings such that the opposing surface is configured to allow vapor from the liquid coolant heated by the heat source to pass through the openings; and
   a gas flow directed toward the opposing surface to carry the vapor from the liquid coolant with the gas flow.

2. The thermal management device of claim 1, further comprising a perforated membrane as the opposing surface, the perforated membrane comprising a plurality of membrane pores such that the vapor can pass through the membrane pores.

3. The thermal management device of claim 2, wherein the membrane apertures of the perforated membrane have diameters ranging from approximately 10 nanometers to approximately 10,000 nanometers.

4. The thermal management device of claim 1, the cavity being configured as a nano/micro-fabricated slit having a height ranging from approximately 0.01 micrometers to approximately 100 micrometers thereby causing the liquid film within the cavity to have a thickness ranging from approximately 0.01 micrometers to approximately 100 micrometers.

5. The thermal management device of claim 1, the heat source disposed in thermal communication with the cavity at a surface of the heat source where heat is generated such that heat dissipating from the heat source evaporates the liquid film to provide the vapor that passes through the opposing surface to remove heat from the heat source.

6. The thermal management device of claim 1, further comprising at least one heat conductor disposed at least partially within the cavity, the heat conductor configured to transfer heat toward at least one of the opposing surface and the liquid film within the cavity.

7. The thermal management device of claim 1, wherein the liquid coolant is a dielectric such that the dielectric liquid coolant can be proximate an electronic device without shorting the electronic device.

8. A method to transfer and manage thermal energy released at a heat source, the method comprising:
   providing a perforated membrane comprising a plurality of micro/nano-sized fabricated perforations;
   providing a liquid film having a desired thickness and a desired pressure in a cavity, the cavity disposed generally between a heat source and the perforated membrane;
   evaporating at least a portion of the liquid film with the heat source to form a vapor such that the vapor of the liquid film passes through at least a portion of the perforations; and
   providing a gas flow proximate the perforated membrane to mix with the vapor to form gas-vapor mixture and to carry the vapor in the direction of the gas flow.

9. The method of claim 8, wherein providing the perforated membrane comprises providing a semipermeable membrane, the semipermeable membrane configured to allow the vapor to pass through membrane and not allow the liquid film to pass through the membrane.

10. The method of claim 8, further comprising removing liquid from the gas-vapor mixture and providing the removed liquid to the cavity as the liquid film.

11. The method of claim 8, further comprising shaping the cavity to a predetermined geometrical shape to provide the desired thickness and the desired pressure of the liquid film.

12. The method of claim 8, further comprising controlling the rate of vapor passing through the perforated membrane by adjusting the perforations.

13. The method of claim 8, further comprising providing a coolant proximate at least one of the liquid film and the heat source to remove heat from at least one of the liquid film and the heat source.

14. The method of claim 8, further comprising providing the gas flow at a velocity ranging from approximately 1 meter per second to approximately 300 meters per second.

15. The method of claim 8, further comprising pressurizing the liquid film to the desired pressure such that cavity is substantially filled with the liquid film.

16. The method of claim 8, further comprising at least one of drying or heating at least a portion of gas in the gas flow to enhance evaporation of the liquid film.

17. In a system to transfer and manage thermal energy released at a hot spot on a surface of a chip, a perspirating patch thermal management system comprising:
   a liquid in a cavity, the cavity proximate a hot spot, the cavity configured and shaped to control the thickness of the liquid within the cavity, the liquid being at a temperature lower than the temperature of the hot spot such that the liquid absorbs heat from the hot spot;
   a gas conduit to provide a flow of gas proximate the cavity such that the flow of gas passes proximate the cavity; and
   a perspirating patch disposed in liquid communication with the cavity, the perspirating patch comprising a plurality of holes to receive evaporated liquid from the cavity for presentation toward the flow of gas so that the flow of gas carries the evaporated liquid from the holes of the perspirating patch.

18. The perspirating patch thermal management system of claim 17, further comprising a second liquid in a conduit proximate the liquid, the second liquid having a temperature different from the liquid to absorb heat from the liquid.

19. The perspirating patch thermal management system of claim 17, the gas conduit being configured as a jet with an exhaust disposed toward and at a desired impingement angle to the perspirating patch to provide the flow of gas proximate the perspirating nano-patch.

20. The perspirating patch thermal management system of claim 17, the perspirating patch having at least one tapered surface such that a portion of the flow of gas contacts the tapered surface at an angle.

21. The perspirating patch thermal management system of claim 17, at least a portion of the perforated holes comprising a material coating to control perspiration of the liquid through the perspirating patch.

22. The perspirating patch thermal management system of claim 17, further comprising a second perspirating patch operatively coupled to the perspirating patch, the second perspirating patch configured to manage thermal energy released at a second hot spot such that the perspirating patch and second perspirating patch cool multiple hot spots.

23. The perspirating patch thermal management system of claim 17, the perspirating patch being a semipermeable membrane such that the semipermeable membrane allows evaporated liquid to pass through the semipermeable membrane but not allow liquid to pass through the semipermeable membrane.

24. The perspirating patch thermal management system of claim 17, the plurality of holes of the perspirating patch having a tapered shape such that the diameter of the holes disposed toward the cavity are greater than the diameter of the holes disposed toward the flow of gas.

* * * * *